United States Patent
Rom-Saksonov et al.

(10) Patent No.: US 11,386,008 B1
(45) Date of Patent: Jul. 12, 2022

(54) FALSE HIT DETECTION IN TERNARY CONTENT-ADDRESSABLE MEMORY

(71) Applicant: Amazon Technologies, inc., Seattle, WA (US)

(72) Inventors: Anna Rom-Saksonov, Rosh Haayin (IL); Erez Izenberg, Tel Aviv (IL); Avigdor Segal, Netanya (IL); Jonathan Cohen, Kfar Saba (IL); Nitzan Zisman, Beer Sheva (IL); Noam Attias, Tel Aviv (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/018,105

(22) Filed: Sep. 11, 2020

(51) Int. Cl.
| | |
|---|---|
| *G06F 12/0846* | (2016.01) |
| *G06F 12/02* | (2006.01) |
| *G06F 11/10* | (2006.01) |
| *G06F 11/07* | (2006.01) |
| *G11C 15/00* | (2006.01) |
| *G11C 15/04* | (2006.01) |

(52) U.S. Cl.
CPC ...... *G06F 12/0846* (2013.01); *G06F 11/0772* (2013.01); *G06F 11/1064* (2013.01); *G06F 12/0246* (2013.01); *G11C 15/00* (2013.01); *G06F 2212/1021* (2013.01); *G11C 15/04* (2013.01)

(58) Field of Classification Search
CPC ............. G06F 12/0846; G06F 11/1064; G06F 12/0246; G06F 11/0772; G06F 2212/1021; G11C 15/00; G11C 15/04
See application file for complete search history.

(56) References Cited

U.S. PATENT DOCUMENTS

| | | | |
|---|---|---|---|
| 10,127,983 B1* | 11/2018 | Peterson | G06F 11/1004 |
| 2009/0141528 A1* | 6/2009 | Arsovski | G11C 15/04 365/49.17 |
| 2009/0141530 A1* | 6/2009 | Arsovski | G11C 15/04 365/49.17 |
| 2013/0246698 A1* | 9/2013 | Estan | G06F 16/90339 711/108 |
| 2020/0042450 A1* | 2/2020 | Louie | G06F 12/0895 |
| 2021/0065833 A1* | 3/2021 | Patrascu | G11C 29/42 |
| 2021/0089455 A1* | 3/2021 | Berger | G06F 11/1068 |

OTHER PUBLICATIONS

Pagiamtzis, K. et al., "Content-Addressable Memory (CAM) Circuits and Architectures: A Tutorial and Survey", IEEE Journal of Solid-State Circuits, vol. 41, No. 3, Mar. 2006, 16 pages.

* cited by examiner

*Primary Examiner* — Tasnima Matin
(74) *Attorney, Agent, or Firm* — Kilpatrick Townsend & Stockton LLP

(57) ABSTRACT

A memory apparatus for detecting false hits in a content-addressable memory (CAM) is disclosed. The memory apparatus includes a controller coupled to the CAM and a memory. The controller receives a search result including an address from the CAM, the address corresponding to a matching entry from a first set of data entries that matches a search tag. The controller provides a read address based on the address to the memory, which returns a second data entry from a second set of data entries corresponding to the read address. The controller receives the read data and generates an error detection result based on a comparison between the second data entry and the search tag.

20 Claims, 8 Drawing Sheets

FALSE HIT DETECTION IN TERNARY CONTENT-ADDRESSABLE MEMORY

BACKGROUND

Content-addressable memory (CAM) is a type of computer memory that is similar to conventional semiconductor memory, such as random access memory (RAM), but that includes additional circuitry that provide additional functionality. For example, while conventional memory typically performs read and write operations, the additional circuitry in CAMs allow them to support search operations, which can be performed in a single clock cycle. Because a CAM can search its memory in a single clock cycle, it is faster than RAM in essentially all search applications.

To perform a search operation, a CAM may be provided with an input data word and the CAM may return a list of memory addresses (or a single memory address) where the input data word is found, which is in contrast to conventional memory in which a memory address is provided and the data word stored at that memory address is returned. As such, CAMs are used in a number of applications that require search-intensive tasks, such as packet forwarding and packet classification in network routers, among other possibilities.

However, compared to RAM, CAM can have certain cost disadvantages. Unlike a RAM chip, which has simple storage cells, each individual memory bit in a fully parallel CAM has its own associated comparison circuit to detect a match between the stored bit from the stored data word and the input bit from the input data word. Furthermore, match outputs from each cell in the data word are combined to yield a complete data word match signal. The additional circuitry increases the physical size and manufacturing cost of the CAM chip and also increases power dissipation since every comparison circuit is active on every clock cycle. As such, CAM is used in specialized applications where searching speed cannot be accomplished using a less costly method.

Different types of CAM include binary CAM and ternary CAM (TCAM). The main difference between the two is that TCAM allows matching to a "don't care" bit in addition to 1's and 0's. As an example, a TCAM can include a stored data word of "10X0X" and can indicate that a match was found for input data words of "10000", "10100", "10001", and "10101". Since binary CAM does not support "don't' care" bits and must perform exact-match searches using only 1's and 0's, separate stored data words for each of "10000", "10100", "10001", and "10101" would need to be included. TCAM further allows input data words to include one or more "don't care" bits. As an example, a TCAM can search using an input data word of "10X0X" and can indicate that a match was found for stored data words of "10000", "10100", "10001", and "10101".

BRIEF DESCRIPTION OF THE DRAWINGS

Various embodiments in accordance with the present disclosure will be described with reference to the drawings, in which.

DETAILED DESCRIPTION

Figure 1:
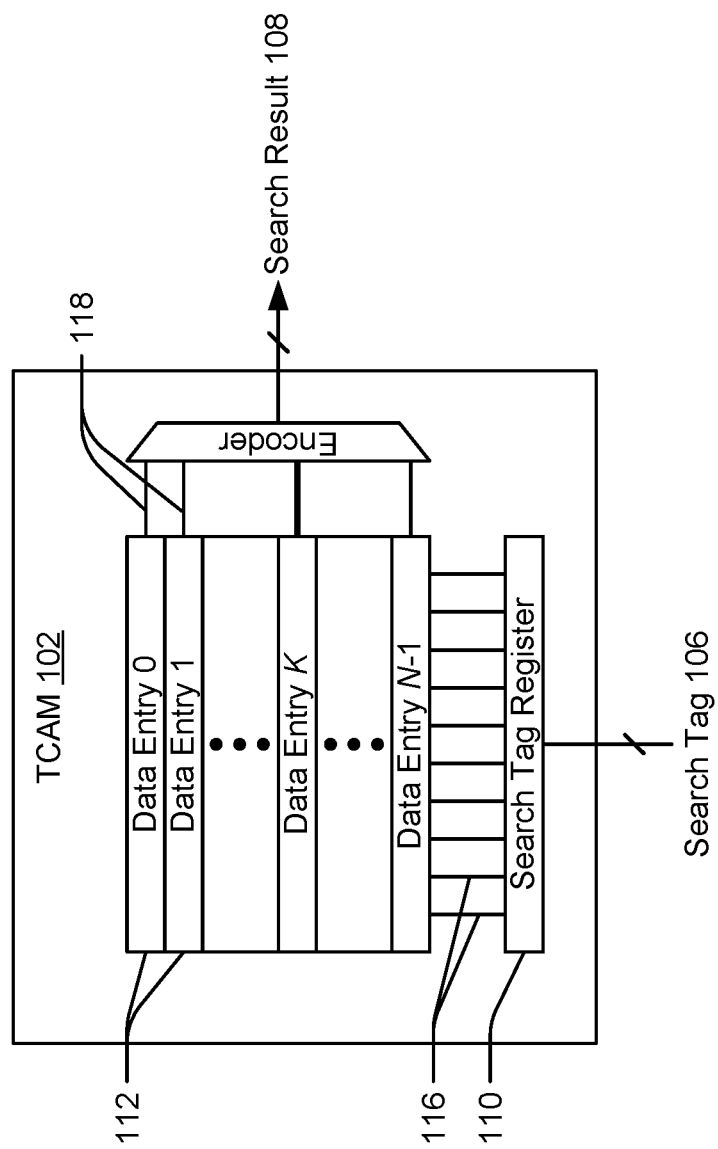
FIG. 1 illustrates an example TCAM.

Similar to other silicon-based devices, ternary content-addressable memory (TCAM) can experience soft errors in which a signal has an incorrect value or state due to, for example, radiation incident on the silicon. A soft error can result in a TCAM reporting a false hit for an input data word that does not have a matching stored data word in the TCAM. For example, a flipped first bit for a stored data word of "0000X" can cause a TCAM to report a false hit for an input data word of "10000". A false hit can result in numerous problems in the wider system in which a TCAM is implemented. As an example, a false hit can cause a packet to be sent to a first destination device that is not expecting to receive the packet. The packet may further be prevented from reaching a second destination device that requested the packet. The misrouted packet may cause delays both to the first and second destination devices.

Many computer memory devices are designed to detect and/or correct soft errors. Many approaches include using extra memory bits and memory controllers that exploit these extra bits. As an example, a redundant parity bit may be stored that represents the parity (e.g., odd or even) of a section of data in a memory. Errors in the section of data may be detected by computing the parity and subsequently comparing to the redundant parity bit. Additional memory bits can allow for one or more errors in the section of data to be corrected. For example, Hamming codes can detect two-bit errors or optionally correct one-bit errors without detection of uncorrected errors. While such approaches can be employed in random access memory (RAM), TCAM does not support operations for performing a parity bit check and is generally incompatible with conventional techniques for detecting or correcting bit errors.

Embodiments of the present disclosure provide techniques for detecting false hits as a result of soft errors that may occur in TCAM devices. Some embodiments provide for a memory apparatus which includes the TCAM itself along with a single-port memory or a pair of single-port memories, such as RAMs. The dimensions of each memory may match the dimensions of the TCAM and may include similar data entries stored at similar addressable locations. The memory apparatus may further include a TCAM controller that is electrically coupled to each of the TCAM and the memories.

In some embodiments, the memory apparatus is provided with a search tag to be searched within the TCAM. The TCAM controller may receive the search tag and provide the search tag to the TCAM. The search tag may be loaded onto a search tag register of the TCAM and the TCAM may search for a matching data entry in a table of data entries. Upon finding the matching data entry, the TCAM may return the address of the matching data entry to the TCAM controller, which may then provide the address to the memory (or pair of memories). The memory may perform a read operation by returning the data entry that is located at the address to the TCAM controller.

The TCAM controller may include compare logic for comparing the data entry returned by the memory to the search tag provided to the TCAM. If the data entry matches the search tag, it may be determined that no search error occurred during the address lookup. Accordingly, the address may be outputted by the memory apparatus along with a flag that indicates that no error or false hit was detected. On the other hand, if the data entry does not match the search tag, it may be determined that a search error occurred during the address lookup. The TCAM controller may output a flag that indicates that an error or false hit was detected and the broader system may react accordingly.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates an example TCAM 102, according to some embodiments of the present disclosure. The TCAM 102 compares a search tag 106 against a table of a set of data entries 112 and returns a search result 108 that includes the address of the matching data entry from the data entries 112. The search tag 106 may alternatively be referred to as a search word and the data entries 112 may alternatively be referred to as stored words. In some instances, the search tag 106 is loaded onto a search tag register 110 and individual values of the search tag 106 are sent down search lines 116 to the data entries 112. Each of the stored data entries 112 includes a matchline 118 that indicates whether the search tag 106 matches the corresponding data entry 112. In the illustrated example, the TCAM 102 includes N data entries 112, with Data Entry K having been found to match the search tag 106, as shown by the increased width of the matchline 118 for Data Entry K.

The matchlines 118 are coupled to an encoder that may generate the address or match location of the matching data entry. If a match is found, the search result 108 may include the address of the matching data entry. Otherwise, the search result 108 may include an indication that no match was found for the search tag 106. Alternatively or additionally, the search result 108 may include a flag that indicates whether or not a match was found (in addition to the address if the flag indicates that the match was found). In some examples, the number of bits in the search tag 106 and the number of stored bits in each of the data entries 112 may be M, the number of data entries 112 may be N, and the number of bits in the address may be $\log_2(N)$.

Figure 2:
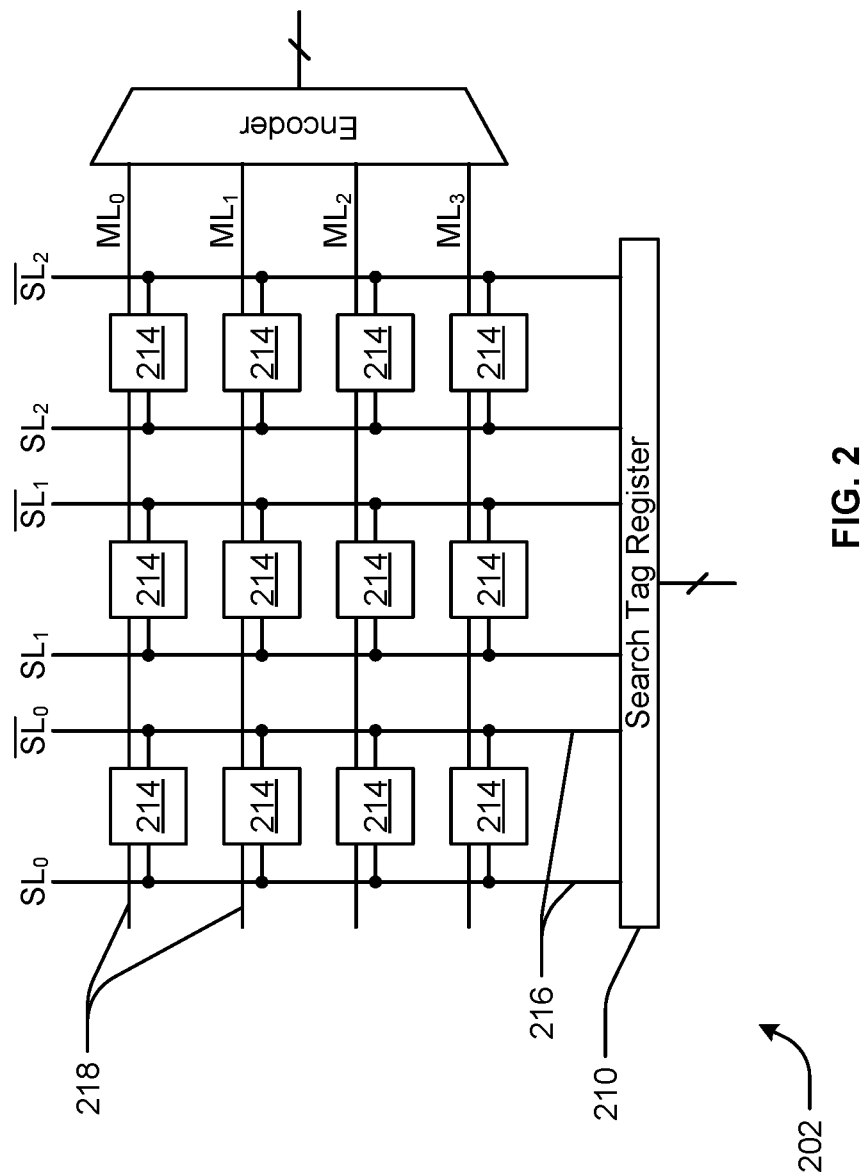
FIG. 2 illustrates an example architecture of a TCAM.

FIG. 2 illustrates an example architecture of a TCAM 202, according to some embodiments of the present disclosure. The TCAM 202 may have similar properties and/or components to the TCAM 102 in FIG. 1, as indicated by similar reference signs of corresponding components. For example, the TCAM 202 may include a search tag register 210 which may receive a search tag and searchlines 216 for sending individual values of the search tag to a set of data entries, each including multiple cells 214. In the illustrated example, the TCAM 202 includes 4 data entries (e.g., N=4), with each data entry containing 3 stored bits (e.g., M=3) corresponding to 3 cells 214 arranged horizontally. TCAM 202 includes a differential pair of searchlines 216 for each of the bits of the search tag, the differential pairs of searchlines 216 being labeled $SL_0$, $\overline{SL_0}$, $SL_1$, $\overline{SL_1}$, $SL_2$, and $\overline{SL_2}$, and a matchline 218 for each of the data entries, the matchlines 218 being labeled $ML_0$, $ML_1$, $ML_2$, and $ML_3$.

When the TCAM 202 broadcasts the search tag from the search tag register onto the searchlines 216, each of the cells 214 compares a stored bit against the bit on a corresponding searchline 216. If the stored bit matches the bit on the corresponding searchline 216, the corresponding matchline 218 may be set to high. Otherwise, if the stored bit does not match the bit on the corresponding searchline 216, the corresponding matchline 218 may be set to low. In some implementations, each of the matchlines 218 may be initially set to high and if any stored bits do not match the corresponding bit of the search tag along the horizontal set of cells 214 for a particular data entry, the corresponding matchline 218 may be set to low (e.g., grounded). Once each of the matchlines 218 have been set to either high or low, the encoder generates the address of the matchline(s) 218 that has been set to high.

Figure 3:
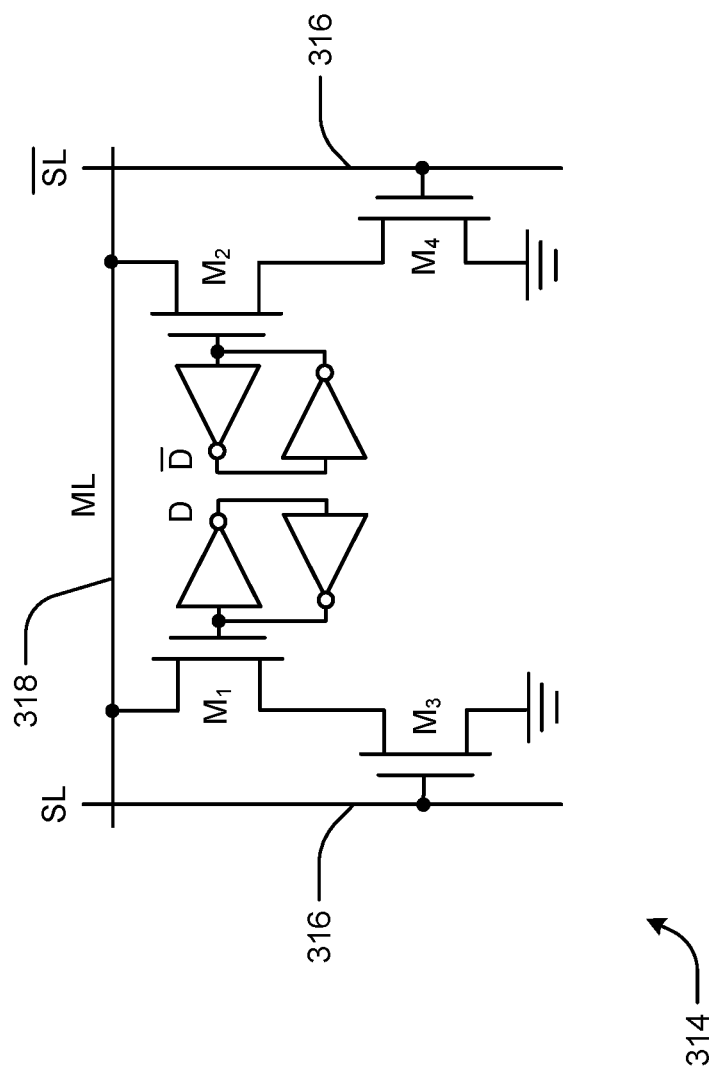
FIG. 3 illustrates an example architecture of a cell of a TCAM.

FIG. 3 illustrates an example architecture of a cell 314 of a TCAM, according to some embodiments of the present disclosure. The cell 314 is capable of storing a logical 1, a logical 0, or a wildcard X in accordance with the following example ternary encoding scheme:

| Encoded Bit | Encoding Bit | | Search Bit |
| --- | --- | --- | --- |
| | D | $\overline{D}$ | |
| 0 | 0 | 1 | 0    1 |
| 1 | 1 | 0 | 1    0 |
| X | 1 | 1 | 0    0 |

The wildcard X is a "don't care" value that represents both a logical 1 and a logical 0. As such, when the stored bit in the cell 314 is a wildcard X, the cell 314 causes a match regardless of whether the corresponding bit of the search tag is a 1 or 0. Each of the encoded bits (alternatively referred to as stored bits or encoded symbols) may be represented using 2 encoding bits D and $\overline{D}$ as shown in the example ternary encoding scheme.

The cell 314 may have similar properties and/or components to the cell 214 in FIG. 2, as indicated by similar reference signs of corresponding components. For example, the cell 314 may be coupled to a pair of searchlines 316 labeled SL and $\overline{SL}$ and a matchline 318 labeled ML. In the illustrated example, the cell 314 is a NOR-type TCAM. To store a ternary value in the cell 314, one encoding bit D is coupled to a left pulldown path and the other encoding bit $\overline{D}$ is coupled to a right pulldown path. To store a logical 1, D is set to a logical 0 and $\overline{D}$ is set to a logical 1, which disables the right pulldown path, causing the cell 314 to set the matchline 318 to high only when SL is set to a logical 1 and $\overline{SL}$ is set to a logical 0. To store a logical 0, D is set to a logical 1 and $\overline{D}$ is set to a logical 0, which disables the left pulldown path, causing the cell 314 to set the matchline 318 to high only when SL is set to a logical 0 and $\overline{SL}$ is set to a logical 1. To store a wildcard X, both D and $\overline{D}$ may be set to a logical 1, which disables the two pulldown paths, causing the cell 314 to set the matchline 318 to high regardless of the values of the searchlines 316.

Figure 4:
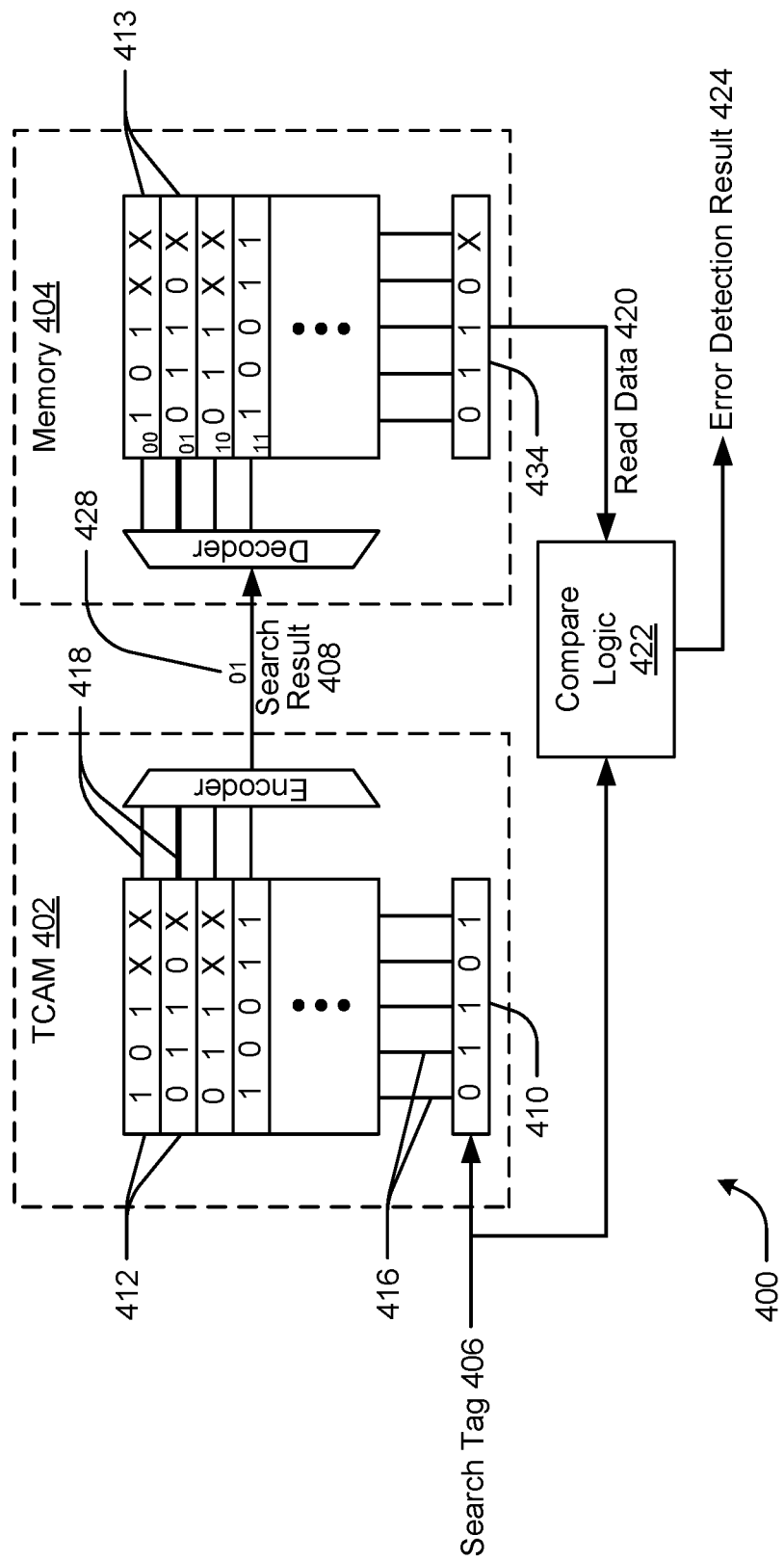
FIG. 4 illustrates an example memory apparatus.

FIG. 4 illustrates an example memory apparatus 400, according to some embodiments of the present disclosure. The memory apparatus 400 may have similar properties and/or components to the examples shown in FIGS. 1-3, as indicated by similar reference signs of corresponding components. For example, the memory apparatus 400 may include a TCAM 402 that includes a search tag register 410 for receiving a search tag 406 and searchlines 416 for sending individual values of the search tag 406 to a set of data entries 412. TCAM 402 further includes matchlines 418 that indicate whether the search tag 406 matches one of the data entries 412 and an encoder for generating a search result 408 including the address 428 of the matching data entry.

The memory apparatus 400 further includes a memory 404 coupled to the TCAM 402 for verifying that the TCAM 402 performed the search for the search tag 406 correctly. For example, the memory 404 may include a set of entries 413 that are similar and/or identical to the data entries 412 of the TCAM 402. When the address 428 is received by the memory 404, the memory 404 may decode the address 428 and cause the stored bits of the corresponding data entry 413 stored at the address 428 to be sent to a memory register 434 and be outputted by the memory 404 as read data 420. Thus, the TCAM 402 may perform an address lookup based on the search tag 406 to generate the address 428 and the memory 404 may perform a memory read based on the address 428 to generate the read data 420.

The memory apparatus 400 further includes compare logic 422 for comparing the read data 420 to the search tag 406. The compare logic 422 may include digital logic for performing a compare operation between the search tag 406 and the read data 420 and generating an error detection result 424 that indicates whether the read data 420 matches the search tag 406. Since one or both of the search tag 406 and the read data 420 may include 2 encoding bits for each of their encoded bits/symbols for representing ternary states, the compare logic 422 may include digital logic for receiving 2M bits from one or both of the search tag 406 and the read data 420. The digital logic may be configured to receive more or fewer than 2M from one or both of the search tag 406 and the read data 420 if different encoding schemes are employed.

In the illustrated example, a search tag 406 consisting of the bits "01101" is provided to the memory apparatus 400. The bits "01101" are loaded onto the search tag register 410 and are broadcast along the searchlines 416 to the data entries 412. The TCAM 402 sets the matchline 418 corresponding to the data entry 412 consisting of "0110X" to high and the remaining matchlines 418 to low, causing the encoder to generate the search result 408 including the address 428 consisting of "01". The memory apparatus 400 sends the bits "01" to the memory 404, which causes the stored bits of the data entry 413 stored at address "01", consisting of the bits "0110X", to be sent to a memory register 434 and be outputted by the memory 404 as read data 420. The memory apparatus 400 sends both the search tag 406, consisting of the bits "01101", and the read data 420, consisting of the bits "0110X" to the compare logic 422, which compares the two and generates an error detection result 424 indicating that no error was detected.

Figure 5:
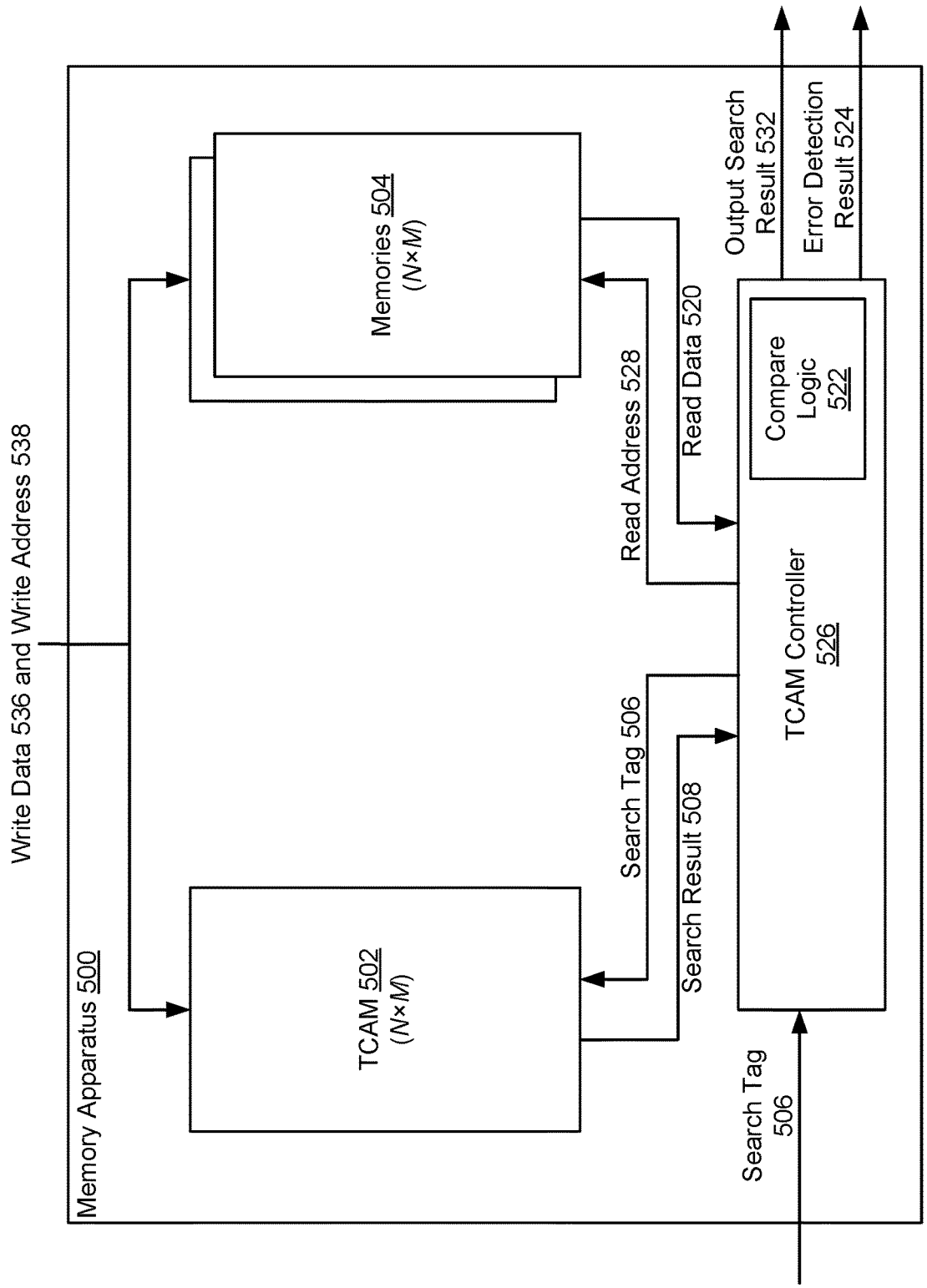
FIG. 5 illustrates an example memory apparatus.

FIG. 5 illustrates an example memory apparatus 500, according to some embodiments of the present disclosure. The memory apparatus 500 may have similar properties and/or components to the examples shown in FIGS. 1-4, as indicated by similar reference signs of corresponding components. For example, similar to the memory apparatus 400 in FIG. 4, the memory apparatus 500 may include a TCAM 502 having a set of data entries and being configured to receive a search tag 506 and return a search result 508 including the address of the data entry that matches the search tag 506. The memory apparatus 500 may further include one or more memories 504 having a set of data entries and being configured to receive a read address 528 and return read data 520 stored at the read address. The memory apparatus 500 may further include a TCAM controller 526 that includes compare logic 522 for comparing the search tag 506 and the read data 520.

The memory apparatus 500 may support address lookup operations along with false hit detection. During an address lookup operation, the memory apparatus 500 may receive the search tag 506, which may be provided to the TCAM controller 526. The TCAM controller 526 may then provide the search tag 506 to the TCAM 502, which may load the search tag 506 onto a search tag register and find a matching data entry from an N×M table of data entries. The TCAM 502 may return a search result 508 to the TCAM controller 526 that includes the address of the matching data entry. The TCAM controller 526 may generate a read address 528 based on the search result 508 and provide the read address 528 to the memories 504. For example, the read address 528 may be the same as or determined based on the address in the search result 508.

Each of the memories 504 may cause the stored bits at the read address 528 to be returned to the TCAM controller 526 in the form of read data 520. In some implementations, the number of memories in the memories 504 may be equal to the number of encoding bits using in the encoding scheme. In other implementations, the number of memories may be different than the number of encoding bits using in the encoding scheme. In the illustrated example, the memory apparatus 500 includes a pair of memories 504 each having dimensions N×M and including data entries that are similar and/or identical to the data entries of the TCAM 502. In some examples, the memories 504 include a first memory with data entries having encoding bits corresponding to the first encoding bit of a ternary encoding scheme and a second memory with data entries having encoding bits corresponding to the second encoding bit of the same ternary encoding scheme. The read data 520 in such embodiments may include M encoding bits from a data entry in the first memory at the read address 528 (corresponding to the first encoding bit) and M encoding bits from a data entry in the second memory at the read address 528 (corresponding to the second encoding bit).

Similar to the compare logic 422 in FIG. 4, the compare logic 522 may include digital logic for performing a compare operation between the search tag 506 and the read data 520 and generating an error detection result 524 that indicates whether the read data 520 matches the search tag 506. Since one or both of the search tag 506 and the read data 520 may include 2M bits for representing ternary states, the compare logic 522 may include digital logic for receiving 2M bits from one or both of the search tag 506 and the read data 520.

The TCAM controller 526 may generate one or both of an output search result 532 and the error detection result 524. The output search result 532 may include the address in the search result 508 if the search tag 506 was found in the TCAM 502 or an indication of a miss if the search tag 506 was not found in the TCAM 502. In some embodiments, if the error detection result 524 indicates that an error was detected (e.g., that a false hit occurred), the output search result 532 may be set to a default value (e.g., all 0's). In some embodiments, the output search result 532 may include the address in the search result 508 regardless of the error detection result 524.

The memory apparatus 500 may further support write operations to the TCAM 502 when the data entries in the TCAM 502 are to be updated. When writing data to the TCAM 502, a similar write operation is performed to the memories 504 so that any changes in the data entries in the TCAM 502 are reflected in the data entries in the memories 504. In the illustrated example, write data 536 and write address 538 are provided to the memory apparatus 500, which causes the write data 536 to be written to each of the TCAM 502 and the memories 504 at the write address 538.

In this manner, the memory apparatus 500 is able to support false hit detection as a result of soft errors that may occur in the TCAM 502. The broader system that incorporates the memory apparatus 500 may provide the search tag 506 to the memory apparatus 500 and receive each of the output search result 532 and the error detection result 524 from the memory apparatus 500. The broader system may accordingly interpret the output search result 532 in light of the corresponding error detection result 524. In some examples, when an error is detected, the TCAM controller 526 and/or the broader system may reconfigure the TCAM 502 to correct the soft error. For example, the write data 536 that may include a corrected data entry may be written to the address included in the search result 508 (e.g., by setting the write address 538 to the address included in the search result 508). In some examples, after reconfiguring the TCAM 502, the same search tag 506 may be again or repeatedly provided to the memory apparatus 500 until the error detection result 524 indicates that no error occurred. Other possibilities, variations, and modifications of the described embodiments are contemplated and are considered to be within the scope of the present disclosure.

Figure 6:
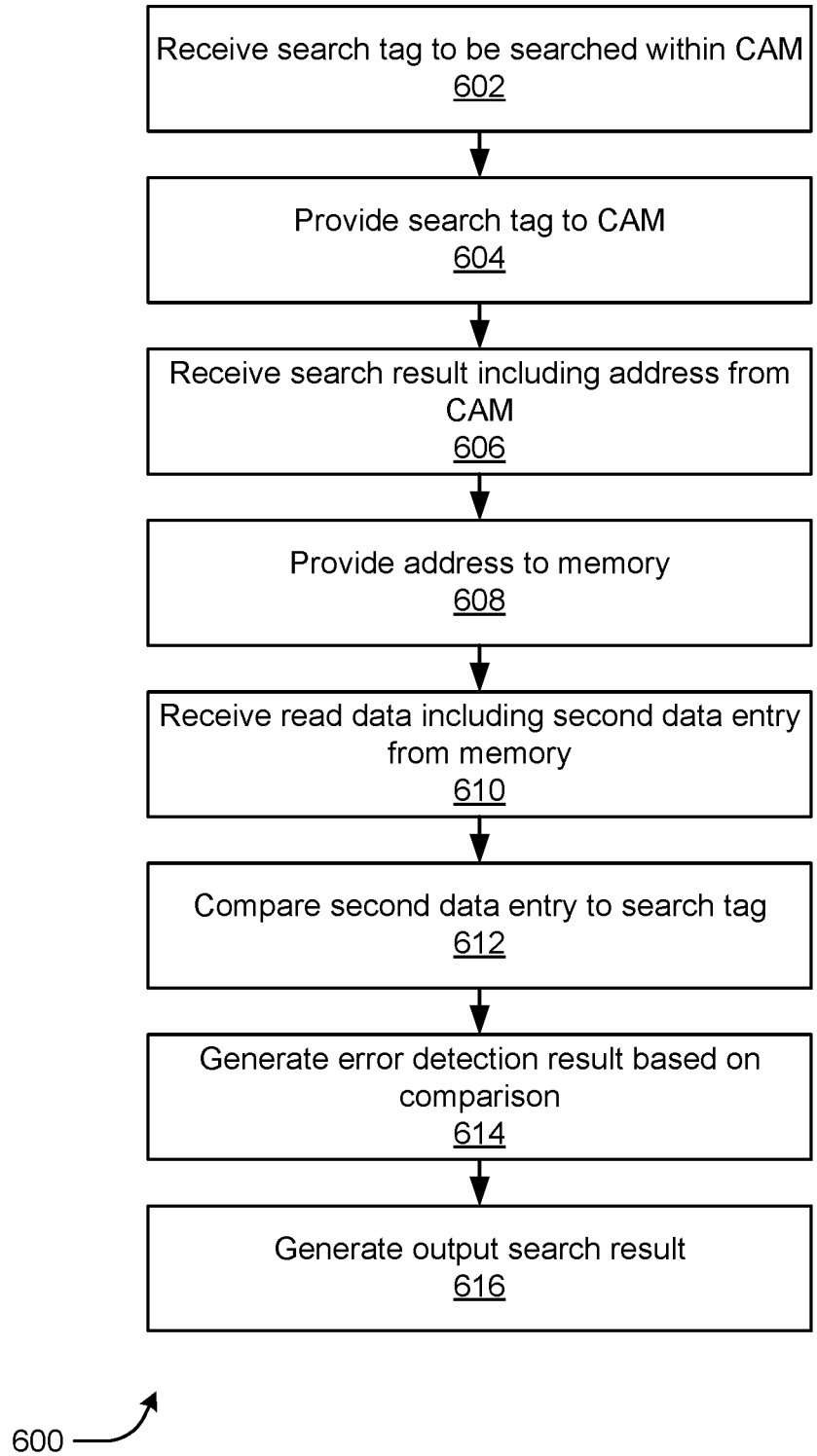
FIG. 6 illustrates an example method of detecting false hits in a CAM.

FIG. 6 illustrates an example method 600 of detecting false hits in a content addressable memory (CAM), according to some embodiments of the present disclosure. One or more steps of method 600 may be omitted during performance of method 600, and steps of method 600 need not be performed in the order shown. One or more steps of method 600 may be performed by one or more processors, such as those included in a controller (e.g., TCAM controller 526). Method 600 may be implemented as a computer-readable medium or computer program product comprising instructions which, when the program is executed by one or more computers, cause the one or more computers to carry out the steps of method 600. Such computer program products can be transmitted, over a wired or wireless network, in a data carrier signal carrying the computer program product.

At step 602, a search tag (e.g., search tags 106, 406, or 506) to be searched within a CAM (e.g., TCAMs 102, 202, 402, or 502) is received. The search tag may be received by a memory apparatus (e.g., memory apparatus 400 or 500), a controller (e.g., TCAM controller 526), and/or a memory apparatus including the controller, among other possibilities. The CAM may be a binary CAM or a TCAM, among other possibilities. The CAM may include a first set of data entries (e.g., data entries 112 or 412) that are stored at a first set of addresses. Each of the first set of data entries may include a plurality of stored bits, and each of the plurality of stored bits may be encoded with two encoding bits representing either a logical 1, a logical 0, or a wildcard X in accordance with a TCAM encoding scheme. The controller may be a CAM controller, a binary CAM controller, or a TCAM controller, among other possibilities.

While the TCAM encoding scheme is generally described herein as providing two encoding bits for encoding each stored bit (or encoded bit/symbol), it should be understood that the TCAM encoding scheme may provide for any number of encoding bits for encoding each stored bit (or encoded bit/symbol). For example, each stored bit may be encoded using 1, 2, 3, 4, or more encoding bits. In one example, 3 encoding bits of [100] may represent the encoded symbol 1, [010] may represent the encoded symbol 0, and [001] may represent the encoded symbol X. Other possibilities are contemplated.

At step 604, the search tag is provided to the CAM. The search tag may be provided to the CAM by the memory apparatus or the controller, among other possibilities. The CAM may receive the search tag and find a first data entry from the first set of data entries that matches the search tag. The CAM may return a search result (e.g., search results 108, 408, or 508) that includes an address (e.g., address 428) from the first set of addresses where the first data entry was found.

At step 606, the search result is received from the CAM. The search result may be received by the memory apparatus or the controller, among other possibilities. The search result may include the address corresponding to the first data entry. The search result may alternatively or additionally include an indication of whether a hit or miss occurred for the search of the search tag in the CAM.

At step 608, the address is provided to one or more memories (e.g., memories 404 or 504). The address may be provided by the memory apparatus or the controller, among other possibilities. The address provided to the one or more memories (e.g., read address 528) may be the same as the address received from the CAM or a translated, mapped, and/or modified address. In embodiments in which a pair of memories are employed, the address may be provided to each of the memories. Each of the one or more memories may include a second set of data entries (e.g., data entries 413) that are stored at a second set of addresses. Each of the one or more memories may receive the address and return read data (e.g., read data 420 or 520) that includes a second data entry from the second set of data entries that is stored at the address. In some implementations, each of the one or more memories may be a RAM or a static RAM (SRAM), among other possibilities.

At step 610, the read data is received from the one or more memories. The read data may be received by the memory apparatus or the controller, among other possibilities. The read data may include the second data entry.

At step 612, the second data entry is compared to the search tag. The comparison may be performed by the memory apparatus or the controller, among other possibilities. In some implementations, the controller may include control logic (e.g., control logic 422 or 522) for performing the comparison.

At step 614, an error detection result (e.g., error detection results 424 or 524) is generated based on the comparison between the second data entry and the search tag. The error detection result may be generated by the memory apparatus or the controller, among other possibilities. In some implementations, the control logic of the controller may generate the error detection result. The error detection result may indicate that a search error was detected (e.g., a false hit) if the second data entry does not match the search tag or that no search error was detected if the second data entry matches the search tag.

At step 616, an output search result (e.g., output search result 532) is generated. The output search result may be generated by the memory apparatus or the controller, among other possibilities. The output search result may include the address. In some embodiments, the output search result may only include the address if the error detection result indicates that no search error was detected. In some embodiments, the address in the output search result 532 may be used to reconfigure the CAM and correct the error.

Figure 7:
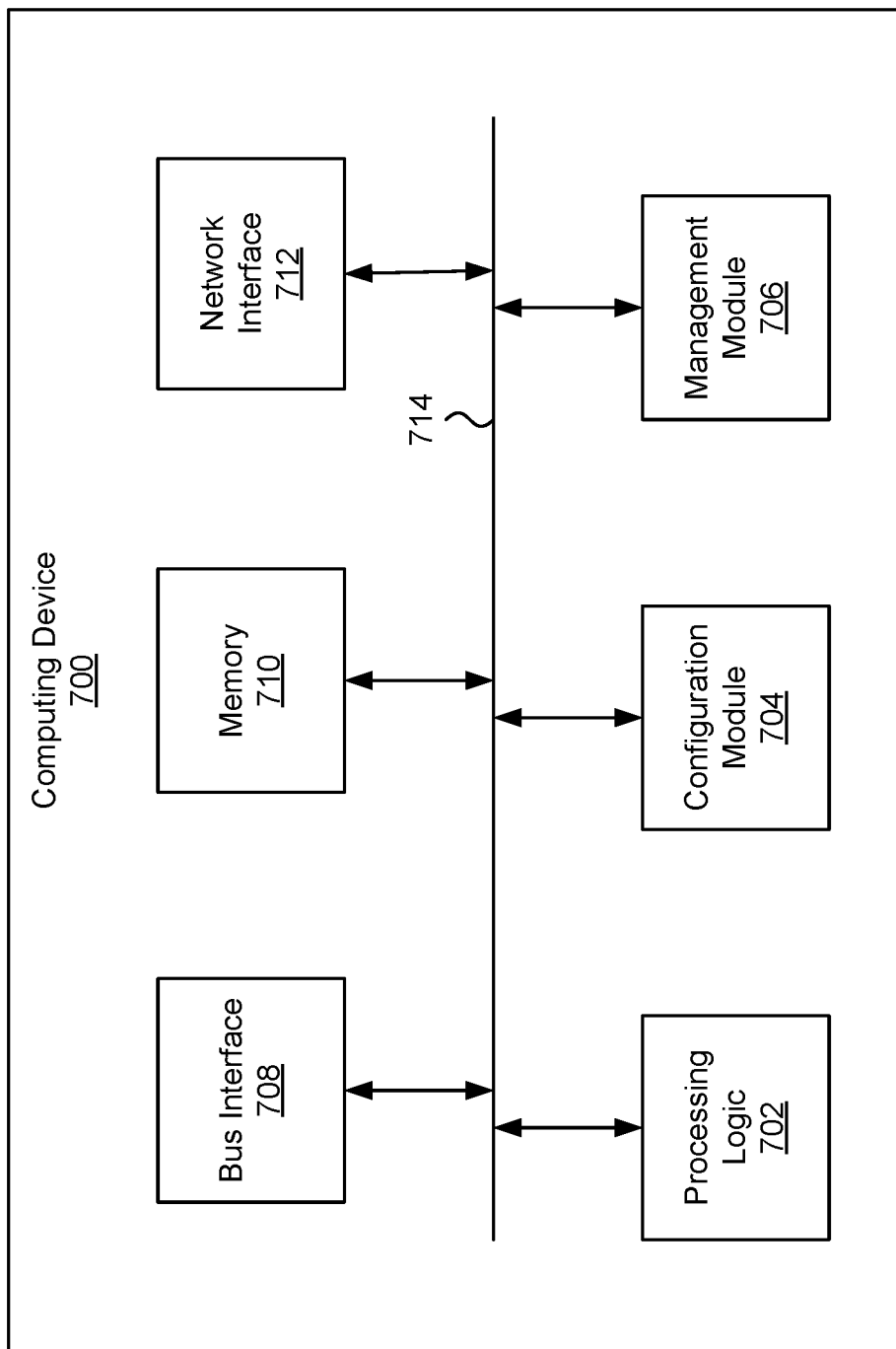
FIG. 7 illustrates an example computing device.

FIG. 7 illustrates an example computing device 700, according to some embodiments of the present disclosure. Functionality and/or several components of the computing device 700 may be used without limitation with other embodiments disclosed elsewhere in this disclosure, without limitations. A computing device 700 may facilitate processing of packets and/or forwarding of packets from the computing device 700 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the computing device 700 may be the recipient and/or generator of packets. In some implementations, the computing device 700 may modify the contents of the packet before forwarding the packet to another device. The computing device 700 may be a peripheral device coupled to another computer device, a switch, a router or any other suitable device enabled for receiving and forwarding packets.

In one example, the computing device 700 may include processing logic 702, a configuration module 704, a management module 706, a bus interface module 708, memory 710, and a network interface module 712. These modules may be hardware modules, software modules, or a combination of hardware and software. In certain instances, modules may be interchangeably used with components or engines, without deviating from the scope of the disclosure. The computing device 700 may include additional modules, not illustrated here, such as components discussed with respect to the nodes disclosed in FIG. 8. In some implementations, the computing device 700 may include fewer modules. In some implementations, one or more of the modules may be combined into one module. One or more of the modules may be in communication with each other over a communication channel 714. The communication channel 714 may include one or more busses, meshes, matrices, fabrics, a combination of these communication channels, or some other suitable communication channel.

The processing logic 702 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 702 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 702 may be stored on a computer-readable storage medium, for example, in the form of a computer program. The computer-readable storage medium may be non-transitory. In some cases, the computer-readable medium may be part of the memory 710.

The memory 710 may include either volatile or non-volatile, or both volatile and non-volatile types of memory. The memory 710 may, for example, include RAM, read only memory (ROM), Electrically Erasable Programmable Read-Only Memory (EEPROM), flash memory, and/or some other suitable storage media. In some cases, some or all of the memory 710 may be internal to the computing device 700, while in other cases some or all of the memory may be external to the computing device 700. The memory 710 may store an operating system comprising executable instructions that, when executed by the processing logic 702, provides the execution environment for executing instructions providing networking functionality for the computing device 700. The memory may also store and maintain several data structures and routing tables for facilitating the functionality of the computing device 700.

In some implementations, the configuration module 704 may include one or more configuration registers. Configuration registers may control the operations of the computing device 700. In some implementations, one or more bits in the configuration register can represent certain capabilities of the computing device 700. Configuration registers may be programmed by instructions executing in the processing logic 702, and/or by an external entity, such as a host device, an operating system executing on a host device, and/or a remote device. The configuration module 704 may further include hardware and/or software that control the operations of the computing device 700.

In some implementations, the management module 706 may be configured to manage different components of the computing device 700. In some cases, the management module 706 may configure one or more bits in one or more configuration registers at power up, to enable or disable certain capabilities of the computing device 700. In certain implementations, the management module 706 may use processing resources from the processing logic 702. In other implementations, the management module 706 may have processing logic similar to the processing logic 702, but segmented away or implemented on a different power plane than the processing logic 702.

The bus interface module 708 may enable communication with external entities, such as a host device and/or other components in a computing system, over an external communication medium. The bus interface module 708 may include a physical interface for connecting to a cable, socket, port, or other connection to the external communication medium. The bus interface module 708 may further include hardware and/or software to manage incoming and outgoing transactions. The bus interface module 708 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 708 may include the physical layer for any of these bus protocols, including a connector, power management, and error handling, among other things. In some implementations, the computing device 700 may include multiple bus interface modules for communicating with multiple external entities. These multiple bus interface modules may implement the same local bus protocol, different local bus protocols, or a combination of the same and different bus protocols.

The network interface module 712 may include hardware and/or software for communicating with a network. This network interface module 712 may, for example, include physical connectors or physical ports for wired connection to a network, and/or antennas for wireless communication to a network. The network interface module 712 may further include hardware and/or software configured to implement a network protocol stack. The network interface module 712 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 700 may include multiple network interface modules, each configured to communicate with a different network. For example, in these implementations, the computing device 700 may include a network interface module for communicating with a wired Ethernet network, a wireless 802.11 network, a cellular network, an Infiniband network, etc.

The various components and modules of the computing device 700, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems as disclosed with respect to FIG. 8.

Figure 8:
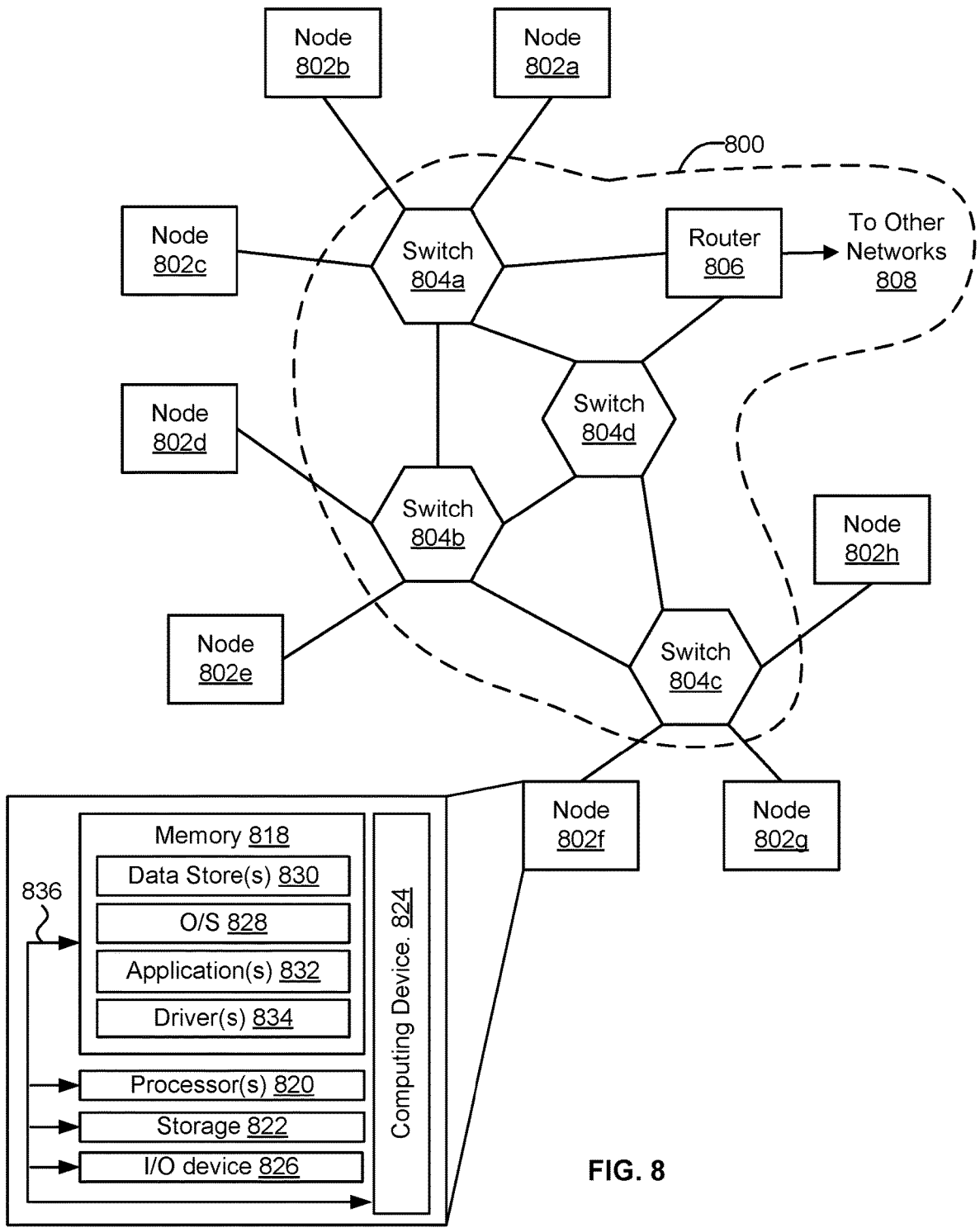
FIG. 8 illustrates an example network.

FIG. 8 illustrates an example network 800, illustrating various different types of computing devices 700 of FIG. 7, such as nodes comprising the computing device, switches and routers. In certain embodiments, the network 800 may be based on a switched architecture with point-to-point links. As illustrated in FIG. 8, the network 800 includes a plurality of switches 804a-804d, which may be arranged in a network. In some cases, the switches are arranged in a multi-layered network, such as a Clos network. A computing device 700 that filters and forwards packets between local area network (LAN) segments may be referred to as a switch. Switches generally operate at the data link layer (layer 2) and sometimes the network layer (layer 3) of the Open System Interconnect (OSI) Reference Model and may support several packet protocols. Switches 804a-804d may be connected to a plurality of nodes 802a-802h and provide multiple paths between any two nodes.

The network 800 may also include one or more computing devices 700 for connection with other networks 808, such as other subnets, LANs, wide area networks (WANs), or the Internet, and may be referred to as routers 806. Routers use headers and forwarding tables to determine the best path for forwarding the packets, and use protocols such as internet control message protocol (ICMP) to communicate with each other and configure the best route between any two devices.

In some examples, network(s) 800 may include any one or a combination of many different types of networks, such as cable networks, the Internet, wireless networks, cellular networks and other private and/or public networks. Interconnected switches 804a-804d and router 806, if present, may be referred to as a switch fabric, a fabric, a network fabric, or simply a network. In the context of a computer network, terms "fabric" and "network" may be used interchangeably herein.

Nodes 802a-802h may be any combination of host systems, processor nodes, storage subsystems, and I/O chassis that represent user devices, service provider computers or third party computers.

User devices may include computing devices to access an application 832 (e.g., a web browser or mobile device application). In some aspects, the application 832 may be hosted, managed, and/or provided by a computing resources service or service provider. The application 832 may allow the user(s) to interact with the service provider computer(s) to, for example, access web content (e.g., web pages, music, video, etc.). The user device(s) may be a computing device such as for example a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device(s) may be in communication with the service provider computer(s) via the other network(s) 808. Additionally, the user device(s) may be part of the distributed system managed by, controlled by, or otherwise part of the service provider computer(s) (e.g., a console device integrated with the service provider computers).

The node(s) of FIG. 8 may also represent one or more service provider computers. One or more service provider computers may provide a native application that is configured to run on the user devices, which user(s) may interact with. The service provider computer(s) may, in some examples, provide computing resources such as, but not limited to, client entities, low latency data storage, durable data storage, data access, management, virtualization, cloud-based software solutions, electronic content performance management, and so on. The service provider computer(s) may also be operable to provide web hosting, databasing, computer application development and/or implementation platforms, combinations of the foregoing or the like to the user(s). In some embodiments, the service provider computer(s) may be provided as one or more virtual machines implemented in a hosted computing environment. The hosted computing environment may include one or more rapidly provisioned and released computing resources. These computing resources may include computing, networking and/or storage devices. A hosted computing environment may also be referred to as a cloud computing environment. The service provider computer(s) may include one or more servers, perhaps arranged in a cluster, as a server farm, or as individual servers not associated with one another and may host the application 832 and/or cloud-based software services. These servers may be configured as part of an integrated, distributed computing environment. In some aspects, the service provider computer(s) may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer(s), may communicate with one or more third party computers.

In one example configuration, the node(s) 802a-802h may include at least one memory 818 and one or more processing units (or processor(s) 820). The processor(s) 820 may be implemented in hardware, computer-executable instructions, firmware, or combinations thereof. Computer-executable instruction or firmware implementations of the processor(s) 820 may include computer-executable or machine-executable instructions written in any suitable programming language to perform the various functions described.

In some instances, the hardware processor(s) 820 may be a single core processor or a multi-core processor. A multi-core processor may include multiple processing units within the same processor. In some embodiments, the multi-core processors may share certain resources, such as buses and second or third level caches. In some instances, each core in a single or multi-core processor may also include multiple executing logical processors (or executing threads). In such a core (e.g., those with multiple logical processors), several stages of the execution pipeline and also lower level caches may also be shared.

The memory 818 may store program instructions that are loadable and executable on the processor(s) 820, as well as data generated during the execution of these programs. Depending on the configuration and type of the node(s) 802a-802h, the memory 818 may be volatile (such as RAM) and/or non-volatile (such as ROM, flash memory, etc.). The memory 818 may include an operating system 828, one or more data stores 830, one or more application programs 832, one or more drivers 834, and/or services for implementing the features disclosed herein.

The operating system 828 may support nodes 802a-802h basic functions, such as scheduling tasks, executing applications, and/or controller peripheral devices. In some implementations, a service provider computer may host one or more virtual machines. In these implementations, each virtual machine may be configured to execute its own operating system. Examples of operating systems include Unix, Linux, Windows, Mac OS, iOS, Android, and the like. The operating system 828 may also be a proprietary operating system.

The data stores 830 may include permanent or transitory data used and/or operated on by the operating system 828, application programs 832, or drivers 834. Examples of such data include web pages, video data, audio data, images, user data, and so on. The information in the data stores 830 may, in some implementations, be provided over the network(s) 808 to user devices 804. In some cases, the data stores 830 may additionally or alternatively include stored application programs and/or drivers. Alternatively or additionally, the data stores 830 may store standard and/or proprietary software libraries, and/or standard and/or proprietary application user interface (API) libraries. Information stored in the data stores 830 may be machine-readable object code, source code, interpreted code, or intermediate code.

The drivers 834 include programs that may provide communication between components in a node. For example, some drivers 834 may provide communication between the operating system 828 and additional storage 822, computing device 824, and/or I/O device 826. Alternatively or additionally, some drivers 834 may provide communication between application programs 832 and the operating system 828, and/or application programs 832 and peripheral devices accessible to the service provider computer. In many cases, the drivers 834 may include drivers that provide well-understood functionality (e.g., printer drivers, display drivers, hard disk drivers, Solid State Device drivers). In other cases, the drivers 834 may provide proprietary or specialized functionality.

The service provider computer(s) or servers may also include additional storage 822, which may include removable storage and/or non-removable storage. The additional storage 822 may include magnetic storage, optical disks, solid state disks, flash memory, and/or tape storage. The additional storage 822 may be housed in the same chassis as the node(s) 802a-802h or may be in an external enclosure. The memory 818 and/or additional storage 822 and their associated computer-readable media may provide non-volatile storage of computer-readable instructions, data structures, program modules, and other data for the computing devices. In some implementations, the memory 818 may include multiple different types of memory, such as SRAM, DRAM, or ROM.

The memory 818 and the additional storage 822, both removable and non-removable, are examples of computer-readable storage media. For example, computer-readable storage media may include volatile or non-volatile, removable or non-removable media implemented in a method or technology for storage of information, the information including, for example, computer-readable instructions, data structures, program modules, or other data. The memory 818 and the additional storage 822 are examples of computer storage media. Additional types of computer storage media that may be present in the node(s) 802a-802h may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, solid state drives, or some other medium which can be used to store the desired information and which can be accessed by the node(s) 802a-802h. Computer-readable media also includes combinations of any of the above media types, including multiple units of one media type.

Alternatively or additionally, computer-readable communication media may include computer-readable instructions, program modules or other data transmitted within a data signal, such as a carrier wave or other transmission. However, as used herein, computer-readable storage media does not include computer-readable communication media.

The node(s) 802a-802h may also include I/O device(s) 826, such as a keyboard, a mouse, a pen, a voice input device, a touch input device, a display, speakers, a printer, and the like. The node(s) 802a-802h may also include one or more communication channels 836. A communication channel 836 may provide a medium over which the various components of the node(s) 802a-802h can communicate. The communication channel or channels 836 may take the form of a bus, a ring, a switching fabric, or a network.

The node(s) 802a-802h may also contain computing device(s) 824 that allow the node(s) 802a-802h to communicate with a stored database, another computing device or server, user terminals and/or other devices on the network(s) 800. The computing device(s) 824 of FIG. 8 may include similar components discussed with reference to the computing device 700 of FIG. 7.

In some implementations, the computing device 824 is a peripheral device, such as a PCI-based device. In these implementations, the computing device 824 includes a PCI interface for communicating with a host device. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the bus interface module 708 may implement NVMe, and the computing device 824 may be connected to a computing system using a PCIe interface.

A PCI-based device may include one or more functions. A "function" describes operations that may be provided by the computing device 824. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, the computing device 824 may include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 7, FIG. 8, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A memory apparatus comprising:
   a ternary content-addressable memory (TCAM) comprising a first set of data entries that are stored at a first set of addresses, wherein the TCAM is configured to receive a search tag, find a first data entry from the first set of data entries that matches the search tag, and return a search result that includes an address from the first set of addresses corresponding to the first data entry;
   a random-access memory (RAM) comprising a second set of data entries that are stored at a second set of addresses, wherein the RAM is configured to receive the address returned by the TCAM and return read data that includes a second data entry from the second set of data entries corresponding to the address; and a TCAM controller communicatively coupled to the TCAM and the RAM, wherein the TCAM controller is configured to:
receive the search tag to be searched within the TCAM;
provide the search tag to the TCAM;
receive the search result including the address from the TCAM;
provide the address to the RAM;
receive the read data including the second data entry from the RAM;
perform a comparison between the search tag provided as an input to the TCAM and the second data entry received as an output from the RAM; and
generate an error detection result based on the comparison between the second data entry and the search tag.

2. The memory apparatus of claim 1, wherein the TCAM controller includes compare logic configured to compare the second data entry to the search tag.

3. The memory apparatus of claim 1, wherein the TCAM controller is further configured to generate an output search result that includes the address.

4. The memory apparatus of claim 1, wherein each of the first set of data entries includes a plurality of stored bits, wherein each of the plurality of stored bits is encoded with two encoding bits representing either a logical 1, a logical 0, or a wildcard in accordance with a TCAM encoding scheme.

5. A memory apparatus comprising:
a controller communicatively coupled to a content-addressable memory (CAM) and configured to perform operations comprising:
receiving a search result including an address from the CAM, wherein the CAM comprises a first set of data entries that are stored at a first set of addresses, wherein the CAM is configured to receive a search tag and return the address from the first set of addresses corresponding to a matching entry from the first set of data entries that matches the search tag;
providing a read address based on the address to a memory that includes a second set of data entries that are stored at a second set of addresses, wherein the memory is configured to return read data that includes a second data entry from the second set of data entries corresponding to the read address;
receiving the read data including the second data entry from the memory;
performing a comparison between the search tag provided as an input to the CAM and the second data entry received as an output from the memory; and
generating an error detection result based on the comparison.

6. The memory apparatus of claim 5, wherein the controller includes compare logic configured to compare the second data entry to the search tag.

7. The memory apparatus of claim 5, wherein the operations further comprise:
generating an output search result that includes the address.

8. The memory apparatus of claim 5, wherein the CAM is a ternary CAM (TCAM).

9. The memory apparatus of claim 8, wherein each of the first set of data entries includes a plurality of stored bits, wherein each of the plurality of stored bits is encoded with two encoding bits representing either a logical 1, a logical 0, or a wildcard in accordance with a TCAM encoding scheme.

10. The memory apparatus of claim 9, wherein the memory is a first memory, and wherein the controller is configured to receive a first set of encoding bits for the second data entry from the first memory and a second set of encoding bits for the second data entry from a second memory.

11. The memory apparatus of claim 10, wherein the first set of encoding bits correspond to a first encoding bit in accordance with the TCAM encoding scheme and the second set of encoding bits correspond to a second encoding bit in accordance with the TCAM encoding scheme.

12. The memory apparatus of claim 5, wherein the second set of data entries are the same as the first set of data entries.

13. A computer-implemented method comprising:
receiving a search result including an address from a content-addressable memory (CAM), wherein the CAM comprises a first set of data entries that are stored at a first set of addresses, wherein the CAM is configured to receive a search tag and return the address from the first set of addresses corresponding to a matching entry from the first set of data entries that matches the search tag;
providing a read address based on the address to a memory that includes a second set of data entries that are stored at a second set of addresses, wherein the memory is configured to return read data that includes a second data entry from the second set of data entries corresponding to the read address;
receiving the read data including the second data entry from the memory;
performing a comparison between the search tag provided as an input to the CAM and the second data entry received as an output from the memory; and
generating an error detection result based on the comparison.

14. The computer-implemented method of claim 13, wherein the second data entry is compared to the search tag using compare logic of a controller.

15. The computer-implemented method of claim 13, further comprising:
generating an output search result that includes the address.

16. The computer-implemented method of claim 13, wherein the CAM is a ternary CAM (TCAM).

17. The computer-implemented method of claim 16, wherein each of the first set of data entries includes a plurality of stored bits, wherein each of the plurality of stored bits is encoded with two encoding bits representing either a logical 1, a logical 0, or a wildcard in accordance with a TCAM encoding scheme.

18. The computer-implemented method of claim 17, wherein the memory is a first memory, and wherein a controller is configured to receive a first set of encoding bits for the second data entry from the first memory and a second set of encoding bits for the second data entry from a second memory.

19. The computer-implemented method of claim 18, wherein the first set of encoding bits correspond to a first encoding bit in accordance with the TCAM encoding scheme and the second set of encoding bits correspond to a second encoding bit in accordance with the TCAM encoding scheme.

20. The computer-implemented method of claim 13, wherein the second set of data entries are the same as the first set of data entries.

\* \* \* \* \*